(12) United States Patent
Dahaki et al.

(10) Patent No.: US 12,249,903 B2
(45) Date of Patent: Mar. 11, 2025

(54) SWITCHING TECHNIQUE USING PWM FOR INCREASING SWITCHING EFFICIENCY

(71) Applicant: Power Switching LLC, Torrance, CA (US)

(72) Inventors: Alen Dahaki, Torrance, CA (US); Farzad Ahmadkhanlou, Torrance, CA (US); Reza Sarhadi Nia, Torrance, CA (US)

(73) Assignee: Power Switching LLC, CA (US)

( * ) Notice: Subject to any disclaimer, the term of this patent is extended or adjusted under 35 U.S.C. 154(b) by 0 days.

(21) Appl. No.: 18/021,114

(22) PCT Filed: Feb. 10, 2023

(86) PCT No.: PCT/US2023/062441
§ 371 (c)(1),
(2) Date: Feb. 13, 2023

(87) PCT Pub. No.: WO2023/158971
PCT Pub. Date: Aug. 24, 2023

(65) Prior Publication Data
US 2024/0266944 A1    Aug. 8, 2024

Related U.S. Application Data

(60) Provisional application No. 63/311,352, filed on Feb. 17, 2022.

(51) Int. Cl.
*H02M 1/088* (2006.01)
*H02M 7/217* (2006.01)
*H02M 7/5395* (2006.01)
*H03K 4/06* (2006.01)

(52) U.S. Cl.
CPC .......... *H02M 1/088* (2013.01); *H02M 7/217* (2013.01); *H02M 7/5395* (2013.01); *H03K 4/06* (2013.01)

(58) Field of Classification Search
CPC .... H02M 1/088; H02M 7/217; H02M 7/5395; H02M 1/0025; H02M 1/44; H02M 7/219; H02M 7/53871; H02M 3/155–1588; H03K 4/06; H03F 3/217; H03F 2200/351
See application file for complete search history.

(56) References Cited

U.S. PATENT DOCUMENTS 4,700,148 A * 10/1987 Pauly .................... G01M 7/022
                                                    318/128
5,227,963 A *  7/1993 Schauder ............ H02M 7/5395
                                                    318/811

(Continued)

*Primary Examiner* — Yusef A Ahmed
(74) *Attorney, Agent, or Firm* — JT IP Law

(57) ABSTRACT

A method for increasing switching efficiency in a power switching topology includes summing a first signal with a first triangle wave signal and with a square wave signal to generate a second signal. The method further includes creating a second triangle wave signal and a third triangle wave signal. The method also includes comparing the second signal with the second triangle wave signal to generate a first pulse width modulation (PWM) signal. The method also includes comparing the second signal with the third triangle wave signal to generate a second PWM signal. The method further includes generating an output signal based on the first PWM signal and the second PWM signal.

16 Claims, 14 Drawing Sheets

(56) References Cited

U.S. PATENT DOCUMENTS

| | | | | |
|---|---|---|---|---|
| 5,880,947 | A * | 3/1999 | Imanaka | H02M 7/219 363/127 |
| 6,025,706 | A * | 2/2000 | Takimoto | H02M 3/156 323/282 |
| 6,897,698 | B1 * | 5/2005 | Gheorghiu | H02M 3/33571 327/257 |
| 7,084,799 | B1 * | 8/2006 | Butler | H03M 3/3283 341/143 |
| 8,536,841 | B2 * | 9/2013 | Chiu | H02M 3/1588 323/284 |
| 11,496,096 | B2 * | 11/2022 | Delano | H03F 1/0211 |
| 11,799,385 | B1 * | 10/2023 | Mazurek | H02M 3/33584 |
| 2005/0083116 | A1 * | 4/2005 | Risbo | H03F 1/52 330/10 |
| 2005/0179489 | A1 * | 8/2005 | Zepp | H03F 1/32 330/251 |
| 2005/0189933 | A1 * | 9/2005 | Brown | H02M 3/157 323/283 |
| 2005/0206330 | A1 * | 9/2005 | Gheorghiu | H02M 3/158 315/408 |
| 2007/0024365 | A1 * | 2/2007 | Ramaswamy | H03F 3/217 330/251 |
| 2007/0096803 | A1 * | 5/2007 | Ho | H03K 5/1252 330/10 |
| 2007/0210783 | A1 * | 9/2007 | Motoyui | H02P 7/04 323/314 |
| 2008/0265989 | A1 * | 10/2008 | Wang | H03F 3/2173 330/251 |
| 2009/0153114 | A1 * | 6/2009 | Huang | H02M 3/1584 323/282 |
| 2010/0181978 | A1 * | 7/2010 | Kawagoshi | H02M 3/156 323/282 |
| 2010/0321570 | A1 * | 12/2010 | Odagiri | H03F 3/2171 348/E5.009 |
| 2013/0049714 | A1 * | 2/2013 | Chiu | H02M 3/1588 323/271 |
| 2013/0271214 | A1 * | 10/2013 | Van Holland | H03F 3/2178 330/251 |
| 2014/0159689 | A1 * | 6/2014 | Chen | H02M 3/156 323/282 |
| 2015/0270810 | A1 * | 9/2015 | Martin | H03F 3/68 330/10 |
| 2017/0025961 | A1 * | 1/2017 | Seeman | H02M 3/33546 |
| 2018/0254705 | A1 * | 9/2018 | Fay | H03F 3/2173 |
| 2019/0140543 | A1 * | 5/2019 | Fay | H03F 1/0222 |
| 2019/0350064 | A1 * | 11/2019 | Cho | H03K 7/08 |
| 2020/0266769 | A1 * | 8/2020 | Gurlahosur | H03F 1/30 |
| 2021/0028774 | A1 * | 1/2021 | Daher | G06F 1/0328 |
| 2022/0021379 | A1 * | 1/2022 | Hernandez | H03K 7/08 |
| 2022/0045655 | A1 * | 2/2022 | Huang | H03F 1/30 |

* cited by examiner

SWITCHING TECHNIQUE USING PWM FOR INCREASING SWITCHING EFFICIENCY

CROSS-REFERENCE TO RELATED APPLICATIONS

This application claims the benefit and priority of U.S. Provisional Application No. 63/311,352, titled Novel Switching Technique and filed on Feb. 17, 2022, the entire contents of which is hereby incorporated by reference in its entirety.

BACKGROUND

1. Field

The present disclosure relates to circuits used in power switching topologies and, more particularly, to circuits that increase switching efficiency and reduce inherent limitations on power switching topologies.

2. Description of the Related Art

Power switches of various configurations are used in many electronic devices today. These switches may include alternating current (AC) to direct current (DC) converters and DC to AC inverters. More and more devices are being designed to be driven with electricity rather than fossil fuels, thus increasing supply of electrical devices (e.g., electric vehicles (EV), electric mowers and blowers, etc.) and increasing demand for sources of electrical power (e.g., solar panels and associated equipment, electric vehicle hookups that allow an EV to provide power to the electrical grid, etc.). A majority of these devices and power systems utilize switches (e.g., in the power supplies of electrical devices and in the DC to AC inverters of a solar panel system).

All existing switches have some inherent limitations and inefficiencies. For example, a switching frequency of a switch may be limited by hardware limitations, losses, electro-magnetic interference (EMI), or the like. It is desirable to reduce these limitations and inefficiencies. Advantages of switches with a greater switching frequency include reduced size of components, faster transient load response time, and reduced output ripple. Benefits of reduced inefficiencies include reduced cost to operate load equipment, greater output by power sources, and reduced waste in all systems.

Thus, there is a need in the art for systems and methods for improving switching efficiency and reducing inherent limitations on switches.

SUMMARY

Described herein is a method for increasing switching efficiency. The method includes summing a first signal with a first triangle wave signal and with a square wave signal to generate a second signal. The method further includes creating a second triangle wave signal and a third triangle wave signal. The method further includes comparing the second signal with the second triangle wave signal to generate a first pulse width modulation (PWM) signal. The method further includes comparing the second signal with the third triangle wave signal to generate a second PWM signal. The method further includes generating an output signal based on the first PWM signal and the second PWM signal.

In any of the foregoing embodiments, generating the output signal further includes generating at least one feedback signal.

Any of the foregoing embodiments may further include generating the first signal based on the at least one feedback signal.

In any of the foregoing embodiments, the first triangle wave signal is an inverse of a reference triangle wave signal.

In any of the foregoing embodiments, creating the second triangle wave signal includes combining the reference triangle wave signal with a positive reference signal, and wherein creating the third triangle wave signal includes combining the reference triangle wave signal with a negative reference signal.

In any of the foregoing embodiments, comparing the second signal with the second triangle wave signal to generate the first PWM signal includes generating the first PWM signal and generating a first inverse PWM signal that is an inverse of the first PWM signal, and wherein comparing the second signal with the third triangle wave signal to generate the second PWM signal includes generating the second PWM signal and generating a second inverse PWM signal that is an inverse of the first PWM signal.

In any of the foregoing embodiments, generating the output signal is further based on the first inverse PWM signal and the second inverse PWM signal.

In any of the foregoing embodiments, generating the output signal further includes driving a plurality of switches based on the first PWM signal, the first inverse PWM signal, the second PWM signal, and the second inverse PWM signal.

Any of the foregoing embodiments may further include generating a reference triangle wave signal and the square wave signal using an oscillator, wherein the first triangle wave signal is based on the reference triangle wave signal.

In any of the foregoing embodiments, the method can be used in an alternating current (AC) to direct current (DC) converter, and can also be used in a DC to AC inverter.

Also disclosed is a system for increasing switching efficiency. The system includes a first stage configured to output a first signal based on an input signal and at least one feedback signal. The system further includes a second stage configured to sum the first signal with a first triangle wave signal and with a square wave signal to generate a second signal. The system further includes a third stage configured to compare the second signal with a second triangle wave signal to generate a first pulse width modulation (PWM) signal, and to compare the second signal with a third triangle wave signal to generate a second PWM signal. The system further includes a fourth stage configured to generate an output signal based on the first PWM signal and the second PWM signal.

In any of the foregoing embodiments, the fourth stage is further configured to generate the at least one feedback signal.

In any of the foregoing embodiments, the first triangle wave signal is an inverse of a reference triangle wave signal; and the third stage is further configured to create the second triangle wave signal by combining the reference triangle wave signal with a positive reference signal, and to create the third triangle wave signal by combining the reference triangle wave signal with a negative reference signal.

In any of the foregoing embodiments, the third stage is further configured to compare the second signal with the second triangle wave signal to generate the first PWM signal and to generate a first inverse PWM signal that is an inverse of the first PWM signal, and to compare the second signal with the third triangle wave signal to generate the second PWM signal and to generate a second inverse PWM signal that is an inverse of the first PWM signal; and the fourth stage is configured to generate the output signal further based on the first inverse PWM signal and the second inverse PWM signal.

In any of the foregoing embodiments, the fourth stage includes a plurality of switches, and is configured to generate the output signal by driving the plurality of switches based on the first PWM signal, the first inverse PWM signal, the second PWM signal, and the second inverse PWM signal.

Any of the foregoing embodiments may further include an oscillator configured to generate a reference triangle wave signal and the square wave signal, wherein the first triangle wave signal is based on the reference triangle wave signal.

In any of the foregoing embodiments, the system can be implemented in an alternating current (AC) to direct current (DC) converter, and can also be implemented in a DC to AC inverter.

Also disclosed is a system for increasing switching efficiency. The system includes a first summer configured to sum a first signal with a first triangle wave signal and with a square wave signal to generate a second signal. The system further includes a first comparator configured to compare the second signal with a second triangle wave signal to generate a first pulse width modulation (PWM) signal. The system further includes a second comparator configured to compare the second signal with a third triangle wave signal to generate a second PWM signal. The system further includes a plurality of switches configured to be driven based on the first PWM signal and the second PWM signal to generate an output signal.

Any of the foregoing embodiments may further include an inverter configured to invert a reference triangle wave signal to output the first triangle wave signal, and a second summer and a third summer, wherein the second summer is configured to generate the second triangle wave signal by summing the reference triangle wave signal with a positive reference signal; and the third summer is configured to generate the third triangle wave signal by summing the reference triangle wave signal with a negative reference signal.

In any of the foregoing embodiments, the first comparator is further configured to output a first inverse PWM signal that is an inverse of the first PWM signal; the second comparator is further configured to output a second inverse PWM signal that is an inverse of the second PWM signal; and the plurality of switches is configured to be driven further based on the first inverse PWM signal and the second inverse PWM signal, such that the output signal is based on the first PWM signal, the first inverse PWM signal, the second PWM signal, and the second inverse PWM signal.

BRIEF DESCRIPTION OF THE DRAWINGS

Other systems, methods, features, and advantages of the present invention will be or will become apparent to one of ordinary skill in the art upon examination of the following figures and detailed description. It is intended that all such additional systems, methods, features, and advantages be included within this description, be within the scope of the present invention, and be protected by the accompanying claims. Component parts shown in the drawings are not necessarily to scale, and may be exaggerated to better illustrate the important features of the present invention. In the drawings, like reference numerals designate like parts throughout the different views, wherein:

DETAILED DESCRIPTION

Figure 1:
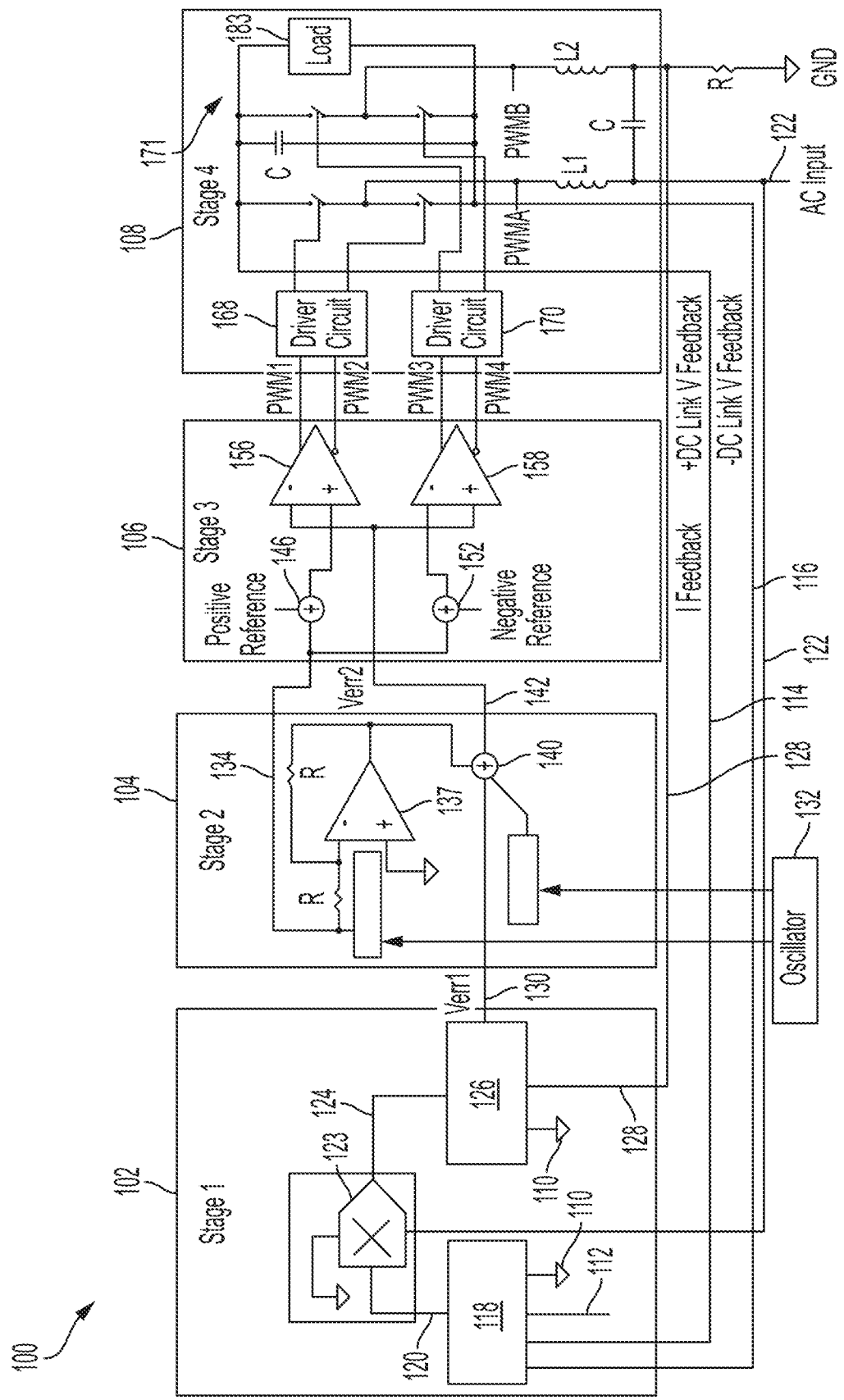
FIG. 1 is a schematic diagram illustrating a system for novel switching techniques (NST) for increasing switching efficiency in an alternating current (AC) to direct current (DC) switching topology, the system including a first stage, a second stage, a third stage, and a fourth stage, according to various embodiments of the present disclosure.

The present disclosure describes systems, apparatuses, circuits, and methods for novel switching techniques (NST). The features of the present disclosure may be implemented in hardware, software, firmware, or any combination thereof. The features of the present disclosure may be used in any systems such as alternating current (AC) to direct current (DC) convertors (e.g., systems that utilize power factor correction (PFC)), DC-AC invertors (e.g., class-D amplifiers), or the like.

The system and methods of the present disclosure provide significant benefits and advantages such as increased overall system efficiency for a wide range of powers and frequencies, thus resulting in greater design flexibility and greater power density. For example, the NST disclosed herein may increase the switching frequency by two or three times while using the same power electronic components. The systems and methods provide additional benefits such as reduced switching loss relative to conventional switching techniques, reduced output ripple relative to conventional switching techniques, lower electromagnetic interference (EMI) and radiation relative to conventional switching techniques, greater design flexibility relative to conventional switching techniques, negligible phase difference, a reduced crest factor relative to conventional switching techniques, and lower total harmony distortion (THD).

Drawing pages are submitted with this disclosure to illustrate exemplary implementations of the disclosed systems and methods. Those skilled in the art will realize that the features of the present disclosure may be implemented in ways that differ from those shown in the drawing pages without departing from the scope of the present disclosure. In addition, the drawings illustrate some simulation results: these results illustrate benefits achieved by the present disclosure but are not intended to limit the disclosure in any way. A switch designed using the present disclosure may achieve improved benefits relative to those shown in the simulation results.

Although various terminology is used throughout the drawings, the specification, and the claims, this terminology is not intended to be limiting. For example, some terminology used in the claims may differ from that used in the specification and the drawings. Such examples are provided below in the format of [claim language (drawing/specification language)]. In addition, some claim language may correspond to a first (or more) term in the drawings/specification for an AC-DC converter and to a second (or more) term in the drawings/specification for a DC-AC converter. Some terminology comparisons between the claims and the drawings/specification may include: first signal (Verr1), first triangle wave signal (triangle waveform or inverse triangle wave), square wave signal (square waveform, square wave), second signal (Verr2), second triangle wave signal (Triangle1), third triangle wave signal (Triangle2), first PWM signal (PWM1), first inverse PWM signal (PWM2), second PWM signal (PWM3), second inverse PWM signal (PWM4), output signal (DC-Link, +DC-Link, −DC-link, output), at least one feedback signal (+DC Link, −DC Link, I Feedback, Current Feedback, Voltage Feedback), positive reference signal (Positive Reference), negative reference signal (Negative Reference), a plurality of switches (SW1, SW2, SW3, SW4), and oscillator (Oscillator). Furthermore, one skilled in the art will realize that a term used in at least one of the drawings, specification, or claims may have a meaning other than a standard meaning of the term as known in the art. Definitions of such terms will be provided in this specification.

The systems disclosed herein include four stages, or primary blocks, to be included in switches. These stages include advanced improvements over conventional switches. The systems herein may further include secondary or auxiliary blocks such as oscillator mute or start up control blocks. The combination of these primary blocks (or the primary blocks and secondary blocks) increases the overall performance of power switching systems for both AC to DC converters and DC to AC inverters. This increased performance may be observed in different design metrics over a wide range of output power. These design metrics in which increased performance may be observed include reduced weight and volume of the system, greater efficiency, reduced cost, and the like.

The first primary stage of the systems for both AC to DC and DC to AC topologies include a voltage and/or current loop. In some topologies (e.g., AC to DC) may also include a multiplier for multiplying the output of the loop. The second primary stage of the systems includes a feedback loop stabilizer. The third primary stage includes pulse width modulation (PWM) and associated drivers. The fourth primary stage includes the power stage and a low pass filter.

Figure 2:
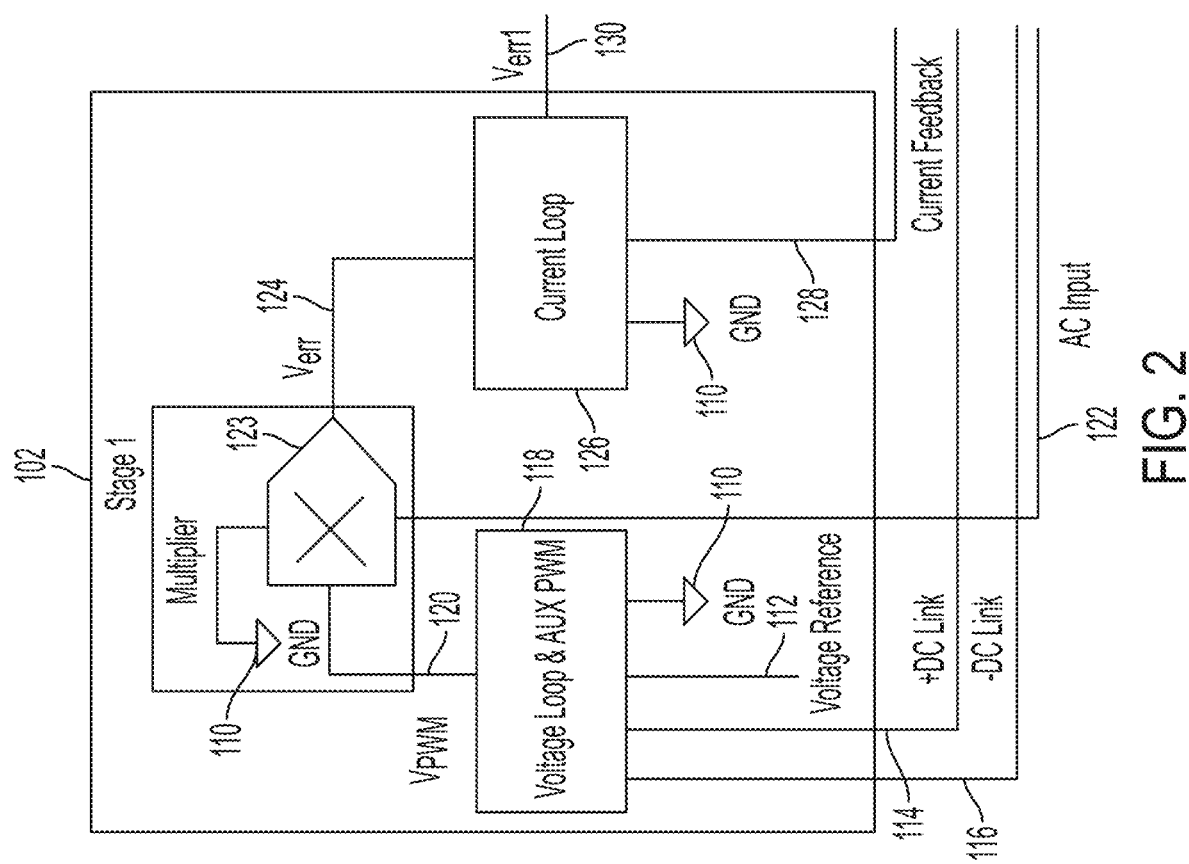
FIG. 2 is a schematic diagram illustrating features of the first stage of the system of FIG. 1, according to various embodiments of the present disclosure.
Figure 3:
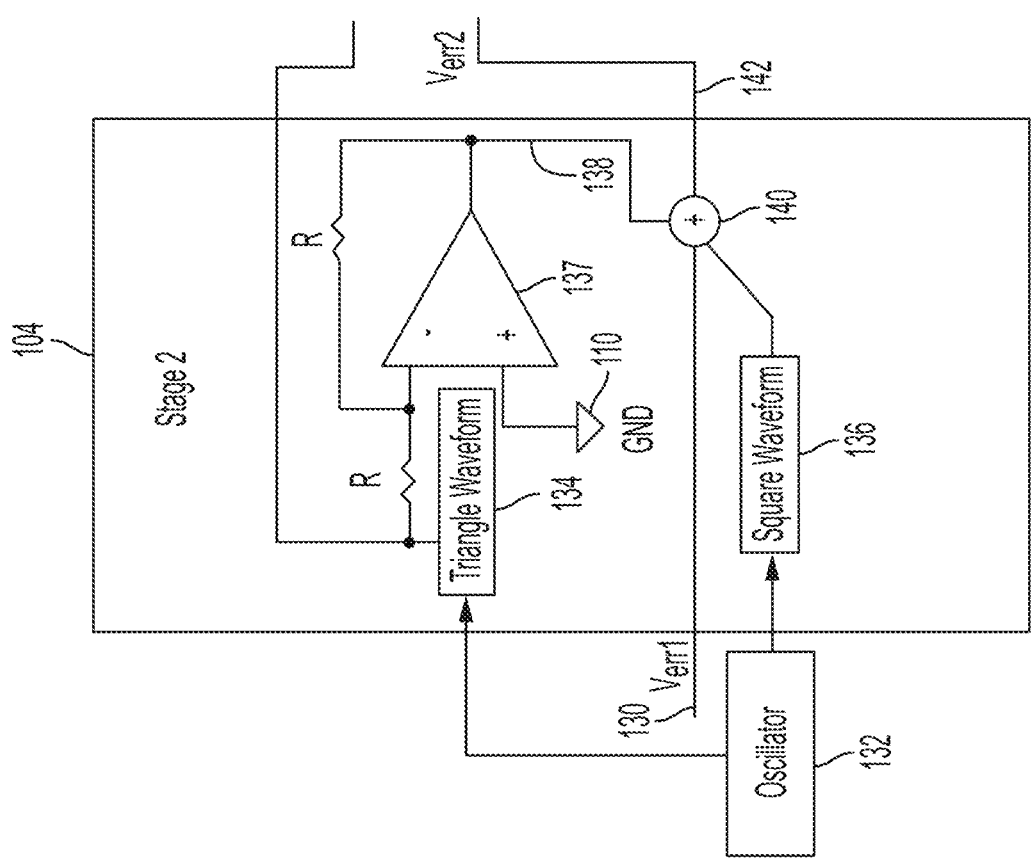
FIG. 3 is a schematic diagram illustrating features of the second stage of the system of FIG. 1, according to various embodiments of the present disclosure.
Figure 4:
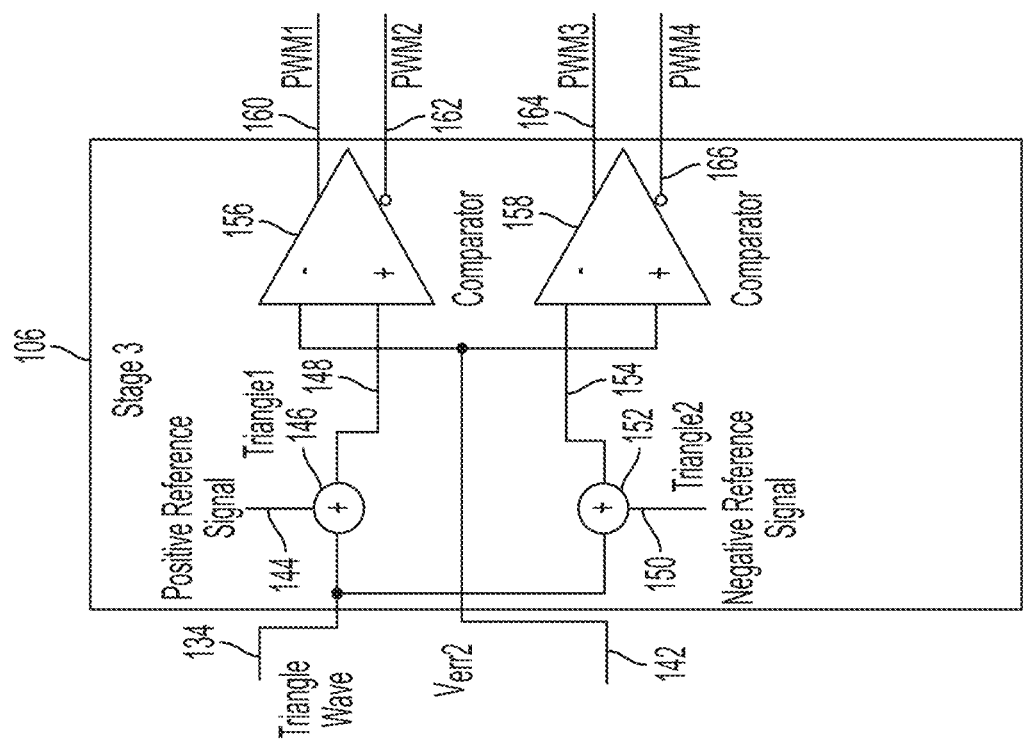
FIG. 4 is a schematic diagram illustrating features of the third stage of the system of FIG. 1, according to various embodiments of the present disclosure.
Figure 5:
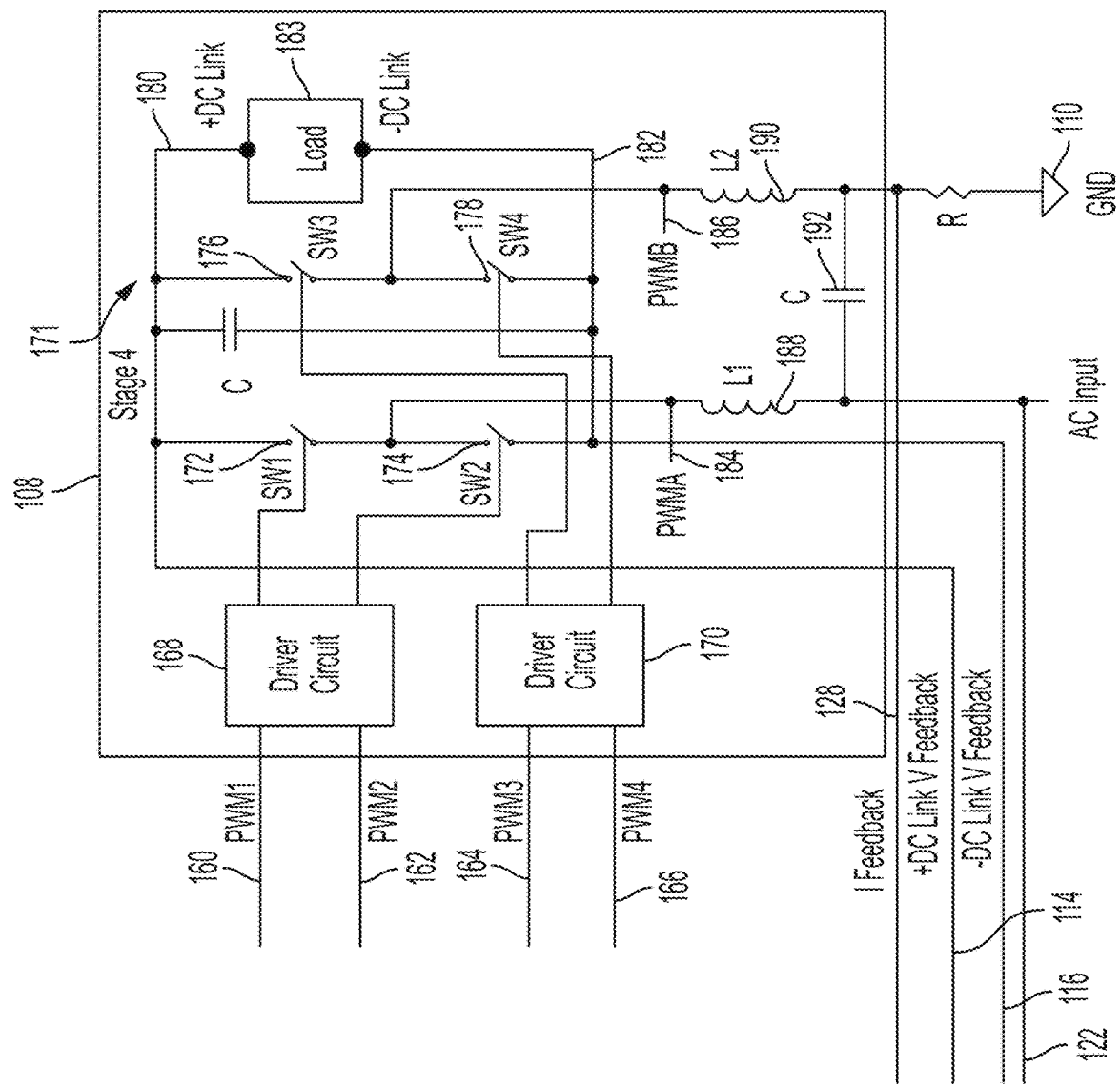
FIG. 5 is a schematic diagram illustrating features of the fourth stage of the system of FIG. 1, according to various embodiments of the present disclosure.

Turning now to FIGS. 1 through 5, schematic diagrams illustrating NST stages of an exemplary system 100 are shown. FIG. 1 illustrates an overview of the entire system 100 including a first stage 102, a second stage 104, a third stage 106, and a fourth stage 108. FIG. 2 illustrates details of the first stage 102, FIG. 3 illustrates details of the second stage 104, FIG. 4 illustrates details of the third stage 106, and FIG. 5 illustrates details of the fourth stage 108. The system 100 shown in FIGS. 1 through 5 is designed to function with an AC to DC converter. Element 110 throughout FIGS. 1 through 5 represents a common ground plane.

The various blocks and elements of the system 100 may be implemented using any combination of electrical elements (including single elements, e.g., a single transistor) as well as any combination of hardware and/or software (e.g., hardware only, software only, or a combination of hardware and software). The symbols representing the blocks and elements are shown as examples and are not meant to limit the disclosure in any way. For example, an operational amplifier may be shown as an inverter; the inverter is not intended to be limited to an op-amp configuration, any inverter type is contemplated.

In the first stage 102, a DC voltage reference 112 is provided to a voltage loop and pulse width modulation (PWM) block 118. In the voltage loop and PWM block 118, the DC voltage reference 112 is compared with a positive DC link feedback voltage 114 and a negative DC link feedback voltage 116 to generate a PWM voltage 120. As shown in FIGS. 1 and 5, the positive DC link feedback voltage 114 and the negative DC link feedback voltage 116 correspond to the output voltage generated in the fourth stage 108 and are returned from the fourth stage 108 to the first stage 102.

The first stage 102 further includes a multiplier 123 in which the PWM voltage 120 is multiplied by the AC input voltage 122. The output of the multiplier 123 is an error voltage 124. In some embodiments, such as in an AC to DC converter, the error voltage 124 may be a periodic signal and may resemble a sine wave.

The first stage further includes a current loop 126 that receives the error voltage 124 and a current feedback signal 128. The current feedback signal 128 is returned from the fourth stage 108 and corresponds to the output of the system 100. In the current loop 126, the error voltage 124 is compared with the current feedback 128 to generate a current error signal 130 (Verr1), also referred to as a first signal 130. The first signal 130 is output by the first stage 102 and received by the second stage 104 as an input.

In the second stage 104, the first signal 130, or current error signal 130, from the current loop 126 is received as an input. An oscillator 132 may generate and output a triangle waveform 134, which may be referred to as a reference triangle wave signal 134, and a square waveform 136, also referred to as a square wave signal 136. The oscillator 132 may include any one or more oscillator designed to output one or more triangle waveform and one or more square waveform. For example, a single oscillator may output both waveforms, or a first oscillator may output the reference triangle wave signal 134 and a second oscillator may output the square wave signal 136. The reference triangle wave signal 134 and the square wave signal 136 may be manipulated so as to have proper ratios of resistance. For example, the second stage 104 may be designed to include circuitry (e.g., circuit layout and electronic components such as resistors) to achieve a desired ratio of resistance. The reference triangle wave signal 134 may be fed into an inverter 137 which outputs an inverse of the reference triangle wave signal 134. The inverter 137 may include any inverter such as an operational amplifier (op-amp) which has its non-inverting input coupled to ground 110 and the inverting input coupled to the reference triangle wave signal 134. The inverse of the reference triangle wave signal 134 may be referred to as a first triangle wave signal 138.

Also in the second stage 104, a first summer 140 may receive the first signal 130 (output by the current loop block 126), the square wave signal 136, and the first triangle wave signal 138 (i.e., the inverse of the reference triangle wave signal 134). The first summer 140 may sum each of the first signal 130, the square wave signal 136, and the first triangle wave signal 138 to generate a second signal 142 (Verr2). That is, the second signal 142 may be a sum of the first signal 130, the square wave signal 136, and the first triangle wave signal 138. Adding the square wave signal 136 and the first triangle wave signal 138 to the first signal 130 may result in increased stability of the feedback loop of the system 100. The second signal 142 (Verr2) may be output by the second stage 104 as an input to the third stage 106. Similarly, the reference triangle wave signal 134 may be received by the third stage 106 as another input. Because the oscillator 132 may be placed anywhere relative to the stages (e.g., in the second stage 104 or outside of all stages as a separate component), the reference triangle wave signal 134 may be provided to the third stage 106 without necessarily being output by the second stage 104.

The third stage 106 may be considered the main stage of the NST system as it includes the pulse width modulation and drivers. In the third stage 106, the reference triangle wave signal 134 is combined with a positive reference signal 144 by a second summer 146 to generate a second triangle wave signal 148. Similarly, the reference triangle wave signal 134 is combined with a negative reference signal 150 by a third summer 152 to generate a third triangle wave signal 154.

A first comparator 156 may receive the second signal 142 (Verr2) and the second triangle wave signal 148 and may output a first PWM signal 160 as a result of the comparison. The first comparator 156 may also output a first inverse PWM signal 162 which is an inverse of the first PWM signal 160. The first comparator 156 may include any hardware or software comparator. For example, the first comparator 156 may include an op-amp designed to receive the second signal as the inverting input and the second triangle wave signal as the non-inverting input.

A second comparator 158 may receive the second signal 142 and the third triangle wave signal 154 and may output a second PWM signal 164 as a result of the comparison. The second comparator 158 may also output a second inverse PWM signal 166 which is an inverse of the second PWM signal 164. As with the first comparator 156, the second comparator 158 may include any hardware or software comparator. For example, the second comparator 158 may include an op-amp designed to receive the second signal as the non-inverting input and the third triangle wave signal as the inverting input.

The four PWM signals generated in the third stage 106 (including the first PWM signal 160, the first inverse PWM signal 162, the second PWM signal 164, and the second inverse PWM signal 166) may be provided to the fourth stage 108. A first driver circuit 168 may receive the first PWM signal 160 and the first inverse PWM signal 162, and a second driver circuit 170 may receive the second PWM signal 164 and the second inverse PWM signal 166. The first driver circuit 168 and the second driver circuit 170 may each drive a plurality of switches 171 based on the plurality of PWM signals. The plurality of switches may include any physical or logical switches such as metal-oxide-semiconductor field-effect-transistor (MOSFET), a bipolar junction transistor (BJT), switches implemented in software or firmware, or the like. In particular, the first driver circuit 168 may drive a first switch 172 and a second switch 174 based on the first PWM signal 160 and the first inverse PWM signal 162, and the second driver circuit 170 may drive a third switch 176 and a fourth switch 178 based on the second PWM signal 164 and the second inverse PWM signal 166. The first switch 172 and the second switch 174 may be connected in series, the third switch 176 and the fourth switch 178 may be connected in series, and the combination of the first switch 172 and the second switch 174 may be connected in parallel with the combination of the third switch 176 and the fourth switch 178.

The first switch 172 and the third switch 176 may be electrically coupled to a positive rail 180 and the second switch 174 and the fourth switch 178 may be electrically coupled to a negative rail 182. A load 183 may be coupled between the positive rail 180 and the negative rail 182 and may be driven by the DC signal between the positive rail 180 and the negative rail 182. The positive DC link feedback voltage 114 may be coupled to the positive rail 180 and may return the signal from the positive rail 180 as the positive DC link feedback, and the negative DC link feedback voltage 116 may be coupled to the negative rail 182 and may return the signal from the negative rail 182 as the negative DC link feedback.

A first PWM line 184 may be coupled between the first switch 172 and the second switch 174, and a second PWM line 186 may be coupled between the third switch 176 and the fourth switch 178. A low pass filter may be located between the first PWM line 184 and the second PWM line 186 and may be formed using a first inductor 188, a second inductor 190, and a capacitor 192. In particular, the first inductor 188 may be coupled between the first PWM line 184 and the AC input 122, the second inductor 190 may be coupled between the ground plane 110 and the second PWM line 186, and the capacitor 192 may be coupled between the first inductor 188 and the second inductor 190. In some embodiments, the low pass filter may alternatively be created using any additional or alternative hardware or software. The current feedback 128 may be coupled between the second inductor 190 and the ground plane 110 and may correspond to current generated by the power stage, or fourth stage 108.

Figure 6:
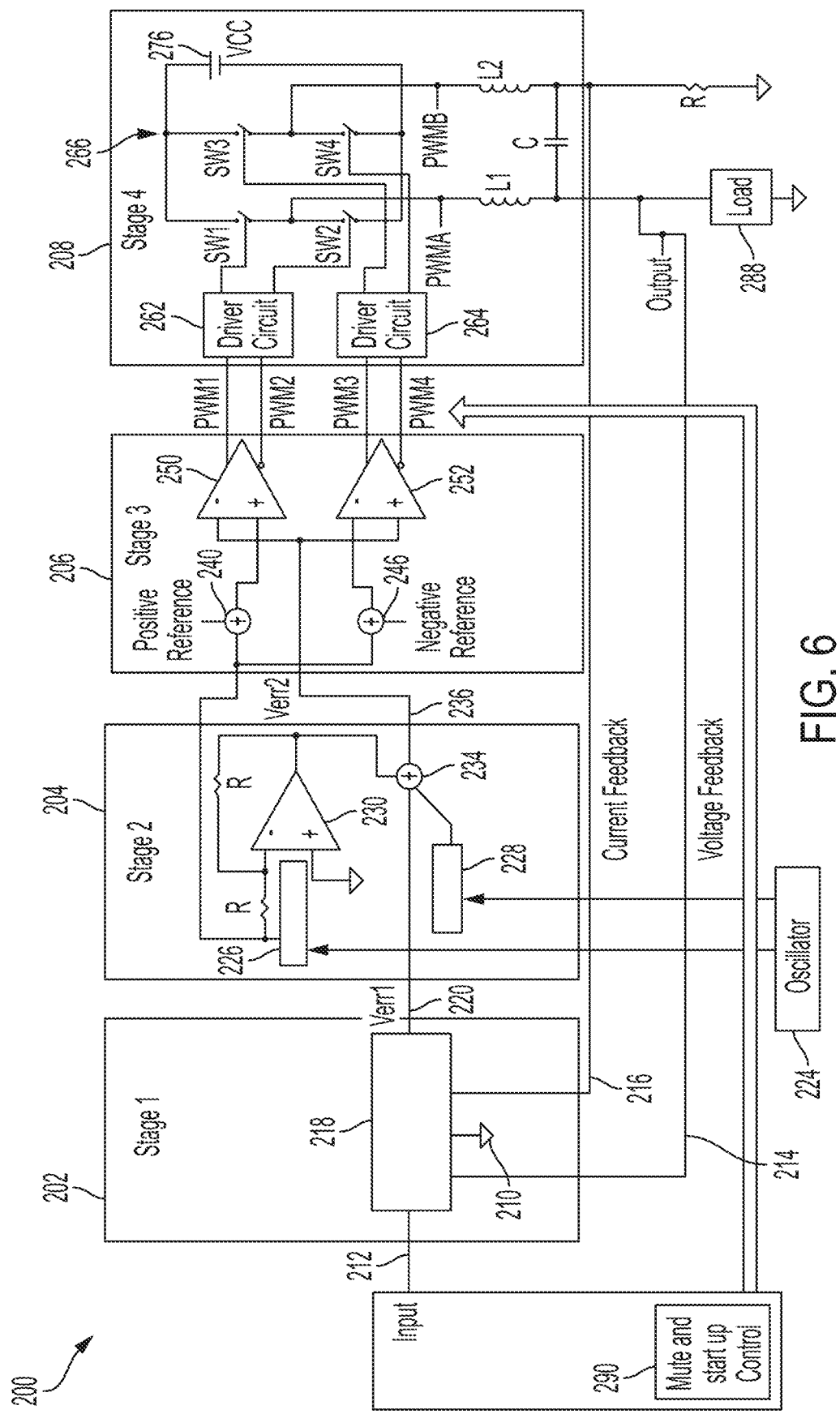
FIG. 6 is a schematic diagram illustrating a system for novel switching techniques (NST) for increasing switching efficiency in a direct current (DC) to alternating current (AC) switching topology, the system including a first stage, a second stage, a third stage, and a fourth stage, according to various embodiments of the present disclosure.
Figure 7B:
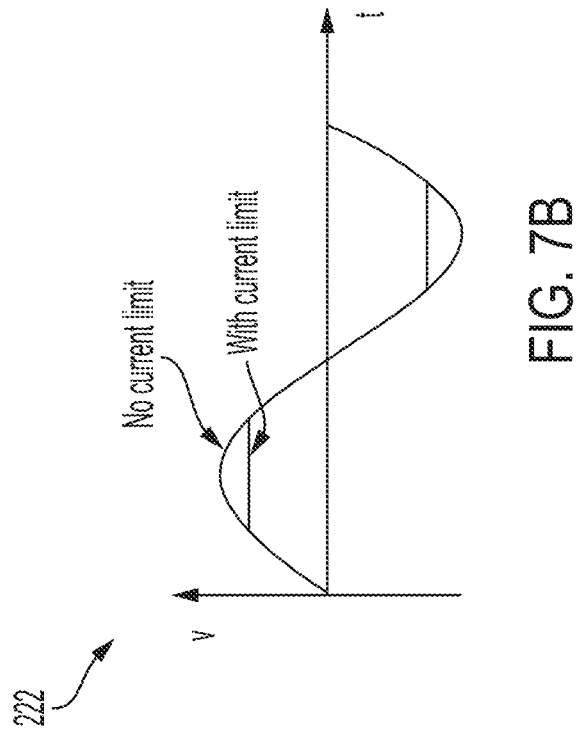
FIG. 7 is a schematic diagram illustrating features of the first stage of the system of FIG. 6, according to various embodiments of the present disclosure.
Figure 7A:
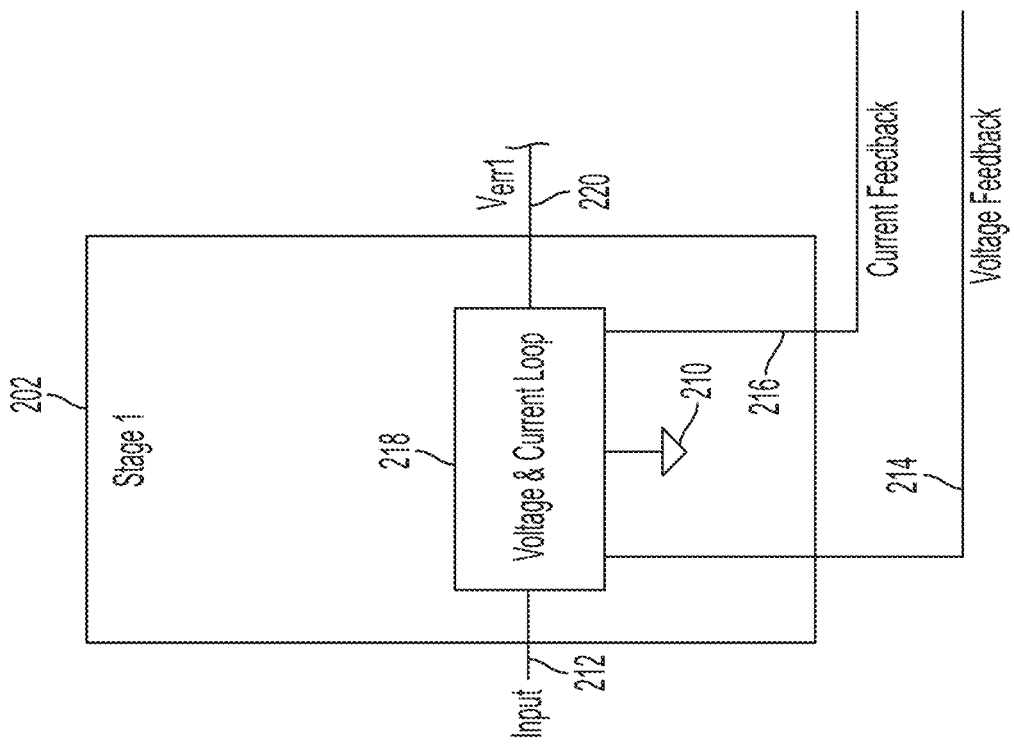
Figures 8, 9:
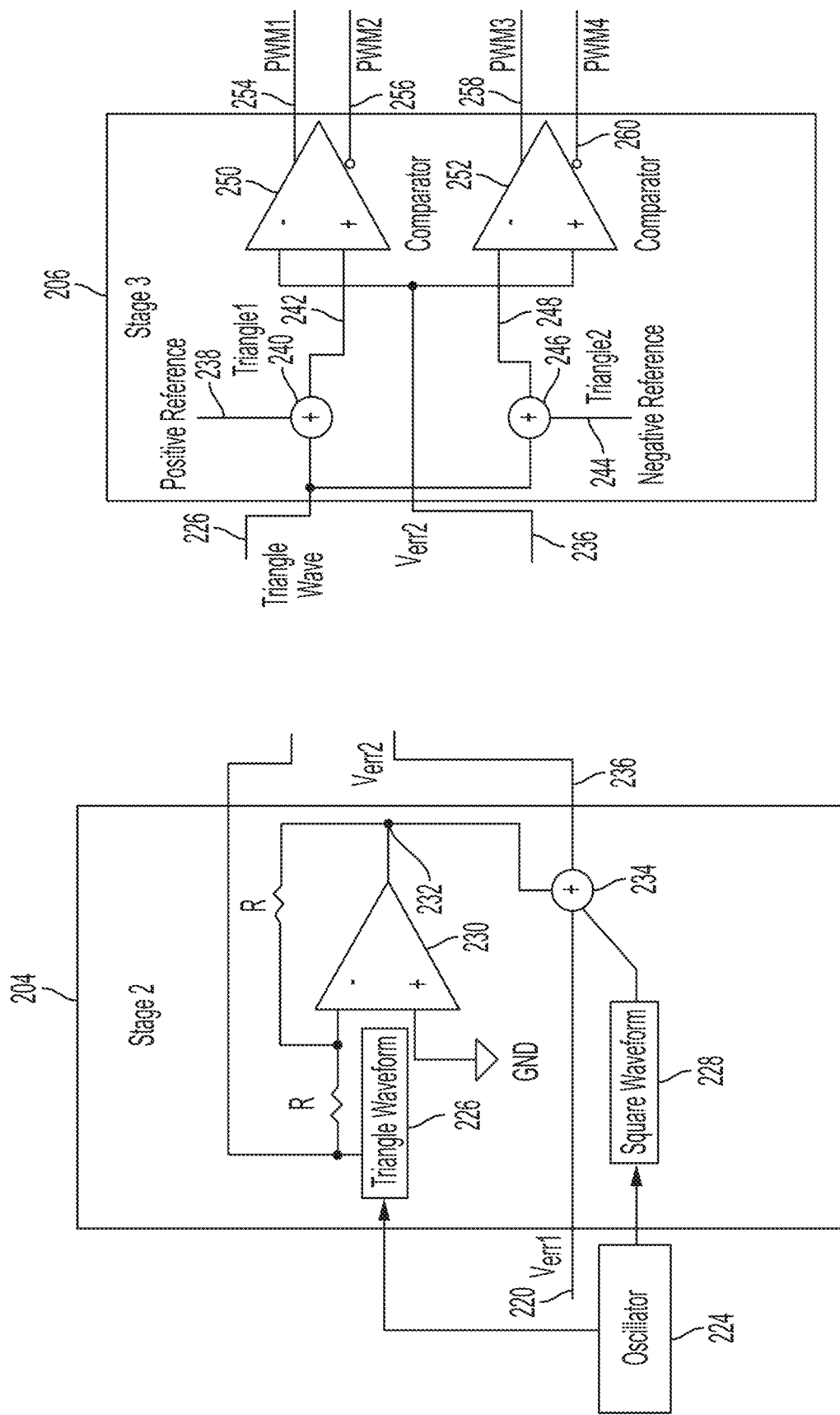
FIG. 8 is a schematic diagram illustrating features of the second stage of the system of FIG. 6, according to various embodiments of the present disclosure.
FIG. 9 is a schematic diagram illustrating features of the third stage of the system of FIG. 6, according to various embodiments of the present disclosure.
Figure 10:
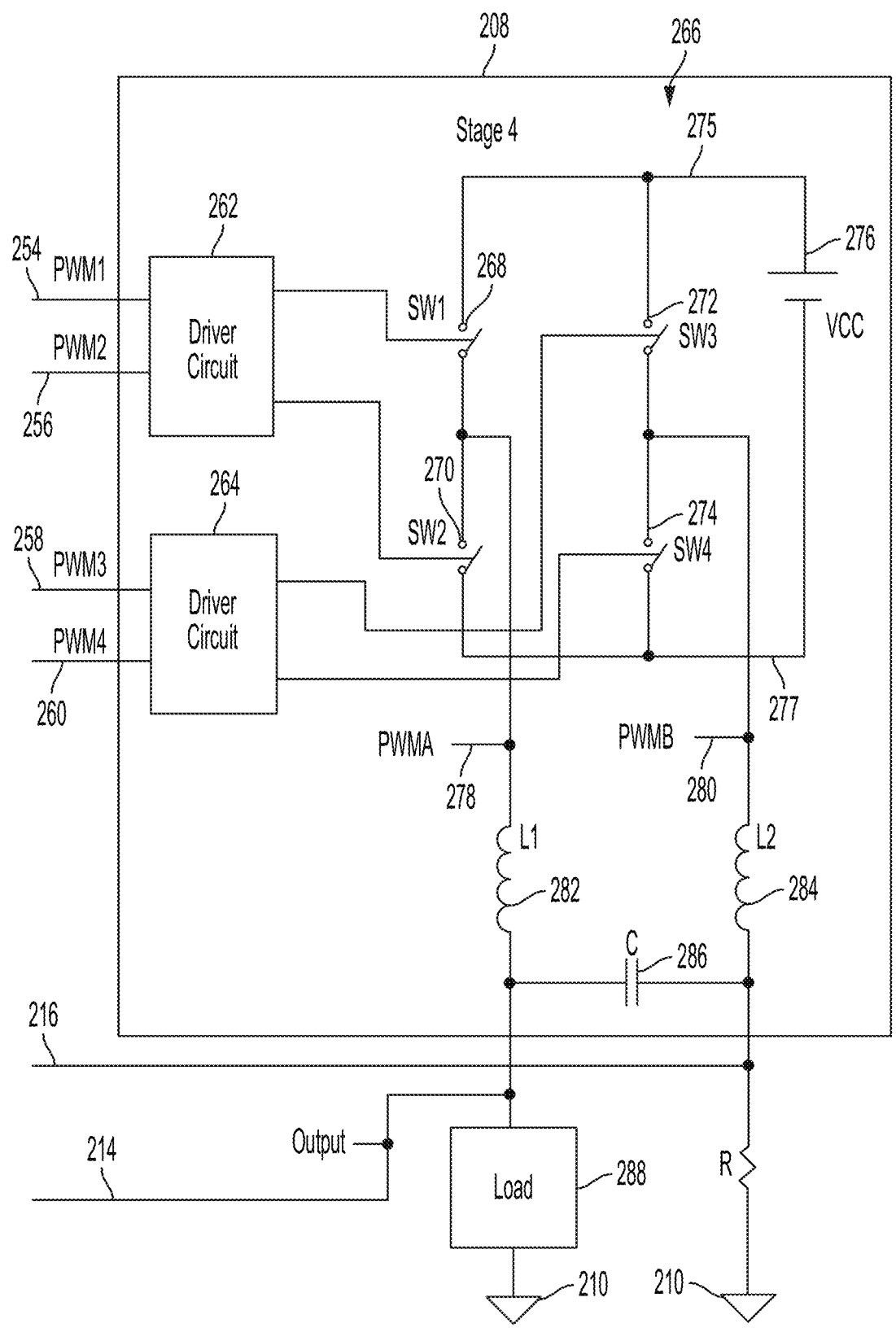
FIG. 10 is a schematic diagram illustrating features of the fourth stage of the system of FIG. 6, according to various embodiments of the present disclosure.

Referring now to FIGS. 6 through 10, schematic diagrams illustrating NST stages of an exemplary system 200 are shown. FIG. 6 illustrates an overview of the entire system 200 including a first stage 202, a second stage 204, a third stage 206, and a fourth stage 208. FIG. 7A illustrates details of the first stage 202, FIG. 8 illustrates details of the second stage 204, FIG. 9 illustrates details of the third stage 206, and FIG. 10 illustrates details of the fourth stage 208. Element 210 throughout FIGS. 6 through 10 represents a common ground plane.

The various blocks and elements of the system 200 may be implemented using any combination of electrical elements (including single elements such as a single transistor) as well as any combination of hardware and/or software (e.g., hardware only, software only, or a combination of hardware and software). The symbols representing the blocks and elements are shown as examples and are not meant to limit the disclosure in any way. For example, an operational amplifier may be shown as an inverter: the inverter is not intended to be limited to an op-amp configuration, any inverter type is contemplated.

The system 200 shown in FIGS. 6 through 10 is designed to function with a DC-AC inverter (as opposed to the system 100 of FIGS. 1-5 which is designed to function with an AC-DC converter). The stages 202, 204, 206, 208 of the system 200 may have similar functions and configurations as the system 100 of FIGS. 1-5. In some embodiments, some of the stages 202, 204, 206, 208 of the system 200 may have changes relative to the corresponding stages of the system 100 to facilitate operation with a DC-AC inverter (rather than the AC-DC converter of the system 100). In some embodiments, some of the stages 202, 204, 206, 208 of the system 200 may be implemented using the same or similar design as the corresponding stages of the system 100.

In the first stage 202, an input voltage 212 along with a voltage feedback signal 214 and a current feedback signal 216 may be provided to a voltage and current loop 218. The input voltage 212 may be received from any power source. The voltage feedback signal 214 and the current feedback signal 216 may be returned to the first stage 202 from the fourth stage 208 as discussed further below. As opposed to the first stage 102 of the embodiment of FIGS. 1-5 (for AC to DC converters), the first stage 202 of the NST system 200 for use with DC to AC inverters may lack a multiplier as the functions of the first stage 102 may be achieved without use of a multiplier.

The voltage and current loop 218 may output a first signal 220, or current error signal 220, which corresponds to an error voltage indicating a difference between the input voltage 212 and the voltage feedback signal 214. In some embodiments, a current limit may be set in the voltage and current loop 218. With brief focus on FIG. 7B, a voltage plot 222 illustrates values of the first signal 220 over time both with and without a current limit set in the voltage and current loop 218. In particular, if no current limit is set, the first signal 220 will be equal to the difference between the input voltage 212 and the voltage feedback signal 214. However, if a current limit is set, then the voltage and current loop 218 will limit the maximum value of the first signal 220 as shown in the voltage plot 222.

Returning reference to FIGS. 6 through 10, the first signal 220, or error voltage, may be provided from the first stage 202 to the second stage 204. In the second stage 204, the first signal 220, or current error signal 220, from the voltage and current loop 218 is received as an input. An oscillator 224 may generate and output a triangle waveform 226, which may be referred to as a reference triangle wave signal 226, and a square waveform 228, also referred to as a square wave signal 228. The oscillator 224 may include any one or more oscillator designed to output one or more triangle waveform and one or more square waveform. For example, a single oscillator may output both waveforms, or a first oscillator may output the reference triangle wave signal 226 and a second oscillator may output the square wave signal 228. The reference triangle wave signal 226 and the square wave signal 228 may be manipulated so as to have proper ratios of resistance. For example, the second stage 204 may be designed to include circuitry (e.g., circuit layout and electronic components such as resistors) to achieve a desired ratio of resistance. The reference triangle wave signal 226 may be fed into an inverter 230 which outputs an inverse of the reference triangle wave signal 226. The inverter 230 may include any inverter such as an operational amplifier (op-amp) which has its non-inverting input coupled to ground 210 and the inverting input coupled to the reference triangle wave signal 226. The inverse of the reference triangle wave signal 226 may be referred to as a first triangle wave signal 232.

Also in the second stage 204, a first summer 234 may receive the first signal 220 (output by the voltage and current loop 218), the square wave signal 228, and the first triangle wave signal 232 (i.e., the inverse of the reference triangle wave signal 226). The first summer 234 may sum each of the first signal 220, the square wave signal 228, and the first triangle wave signal 232 to generate a second signal 236 (Verr2). That is, the second signal 236 may be a sum of the first signal 220, the square wave signal 228, and the first triangle wave signal 232. Adding the square wave signal 228 and the first triangle wave signal 232 to the first signal 220 may result in increased stability of the feedback loop of the system 200. The second signal 236 (Verr2) may be output by the second stage 204 as an input to the third stage 206. Similarly, the reference triangle wave signal 226 may be received by the third stage 206 as another input. Because the oscillator 224 may be placed anywhere relative to the stages (e.g., in the second stage 204 or outside of all stages as a separate component), the reference triangle wave signal 226 may be provided to the third stage 206 without necessarily being output by the second stage 204.

The third stage 206 may be considered the main stage of the NST system 200 as it includes the pulse width modulation and drivers. In the third stage 206, the reference triangle wave signal 226 is combined with a positive reference signal 238 by a second summer 240 to generate a second triangle wave signal 242. Similarly, the reference triangle wave signal 226 is combined with a negative reference signal 244 by a third summer 246 to generate a third triangle wave signal 248.

A first comparator 250 may receive the second signal 236 (Verr2) and the second triangle wave signal 242 and may output a first PWM signal 254 as a result of the comparison. The first comparator 250 may also output a first inverse PWM signal 256 which is an inverse of the first PWM signal 254. The first comparator 250 may include any hardware or software comparator. For example, the first comparator 250 may include an op-amp designed to receive the second signal as the inverting input and the second triangle wave signal as the non-inverting input.

A second comparator 252 may receive the second signal 236 and the third triangle wave signal 248 and may output a second PWM signal 258 as a result of the comparison. The second comparator 252 may also output a second inverse PWM signal 260 which is an inverse of the second PWM signal 258. As with the first comparator 250, the second comparator 252 may include any hardware or software comparator. For example, the second comparator 252 may include an op-amp designed to receive the second signal as the non-inverting input and the third triangle wave signal as the inverting input.

The four PWM signals generated in the third stage 206 (including the first PWM signal 254, the first inverse PWM signal 256, the second PWM signal 258, and the second inverse PWM signal 260) may be provided to the fourth stage 208. A first driver circuit 262 may receive the first PWM signal 254 and the first inverse PWM signal 256, and a second driver circuit 264 may receive the second PWM signal 258 and the second inverse PWM signal 260. The first driver circuit 262 and the second driver circuit 264 may each drive a plurality of switches 266 based on the plurality of PWM signals. The plurality of switches may include any physical or logical switches such as metal-oxide-semiconductor field-effect-transistor (MOSFET), a bipolar junction transistor (BJT), switches implemented in software or firmware, or the like. In particular, the first driver circuit 262 may drive a first switch 268 and a second switch 270 based on the first PWM signal 254 and the first inverse PWM signal 256, and the second driver circuit 264 may drive a third switch 272 and a fourth switch 274 based on the second PWM signal 258 and the second inverse PWM signal 260. The first switch 268 and the second switch 270 may be connected in series, the third switch 272 and the fourth switch 274 may be connected in series, and the combination of the first switch 268 and the second switch 270 may be connected in parallel with the combination of the third switch 272 and the fourth switch 274.

The first switch 268 and the third switch 272 may be electrically coupled to a positive rail 275, and the second switch 270 and the fourth switch 274 may be electrically coupled to a negative rail 277. A voltage source, or Vcc, 276 may be coupled between the positive rail 180 and the negative rail 182.

A first PWM line 278 may be coupled between the first switch 268 and the second switch 270, and a second PWM line 280 may be coupled between the third switch 272 and the fourth switch 274. A low pass filter may be located between the first PWM line 278 and the second PWM line 270 and may be formed using a first inductor 282, a second inductor 284, and a capacitor 286. In particular, the first inductor 282 may be coupled between the first PWM line 278 and a load 288, the second inductor 284 may be coupled between the ground plane 210 and the second PWM line 280, and the capacitor 286 may be coupled between the first inductor 282 and the second inductor 284. In some embodiments, the low pass filter may alternatively be created using any additional or alternative hardware or software. The low pass filter may remove any high frequency signals to generate a desirable DC output on the load 288. The voltage output between the first PWM line 278 and the second PWM line 280 may be proportional to the input voltage 212 from the first stage 202.

The load 288 may be coupled between the first PWM line 278 and the ground 210. In that regard, the load 288 may be driven based on the operation of the plurality of switches 266. The voltage feedback signal 214 may be from the input to the load 288 and may thus correspond to the output voltage. The current feedback signal 216 may be drawn from the output of the low pass filter. The voltage feedback signal 214 and the current feedback signal 216 may be returned to the first stage 202 and fed to the voltage and current loop 218.

In some embodiments, additional optional blocks 290 may be added. These blocks may include a mute block and a start up control block. In some embodiments, a NST system may include a single block that performs both of the mute and startup functions and, in some embodiments, a NST system may include a separate mute block and startup block.

The mute function may turn off, or mute, outputs from the third stage 206 based on a trigger. For example, if an amplitude of the voltage of the input signal 212 is below a threshold voltage then the mute function may mute the outputs from the third stage 206. As used in this context, to "mute the output from the third stage 206" means to turn off the PWM signals (the first PWM signal 254, the first inverse PWM signal 256, the second PWM signal 258, and the second inverse PWM signal 260). Stated differently, muting the output from the third stage 206 may mean to cause the values of the first PWM signal 254, the first inverse PWM signal 256, the second PWM signal 258, and the second inverse PWM signal 260 to be equal to zero.

The startup control function may remove transient signals during initialization or startup of the NST system 200. In particular, the startup control function may cause the PWM signals (the first PWM signal 254, the first inverse PWM signal 256, the second PWM signal 258, and the second inverse PWM signal 260) to turn off (i.e., to have values of zero) for a period of time beginning when the system 200 turns on and until at least a time at which the signals within the NST system 200 have reached steady state. The period of time in which the PWM signals are turned off may be selected based on the time for the NST system 200 to reach steady state operation. For example, the period of time may be 1 second, 3 seconds, 5 seconds, 10 seconds, or the like. This removes all transient signals and ensures the NST system 200 performs as desired after initialization (i.e., once the NST system 200 has achieved steady state operation).

Figure 11:
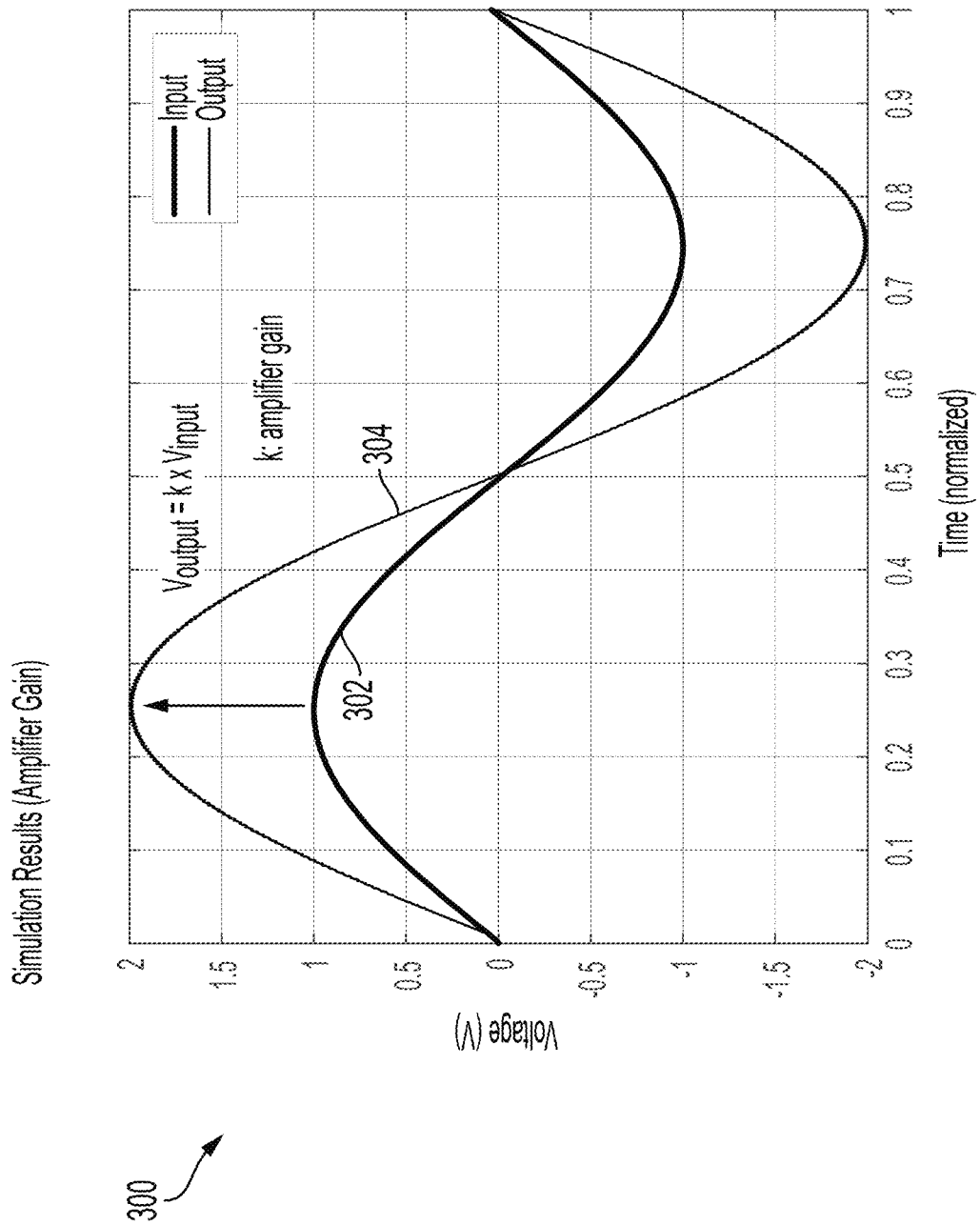
FIG. 11 is a graph illustrating amplification results from a simulation of a NST system, according to various embodiments of the present disclosure.

Referring to FIGS. 11, 12, and 13, multiple simulations were performed using systems similar to the systems 100 of FIGS. 1-5 and 200 of FIGS. 6-10. These simulations demonstrated performance of the NST systems in both AC-DC converters and DC-AC inverters. In particular, increased efficiency and increased performance of both AC-DC converters and DC-AC inverters were observed in simulations for a wide range of powers and frequencies, meaning that implementation of NST will provide greater design flexibility and power density. The simulations demonstrated that NST increases the switching frequency by at least two or three times using the same power electronic components. The simulations further demonstrated that NST reduces switching loss, output ripple, electro-magnetic interference (EMI), and radiation.

Referring to FIG. 11, a graph 300 illustrates exemplary amplification gain of a NST system (e.g., the NST system 200 of FIGS. 6-10). As shown in the graph 300, an input sign 302 (e.g., the input signal 212 of FIG. 6) is amplified in the system by an amount of gain (k) to generate an output signal 304 (e.g., the voltage feedback signal 214 of FIG. 6). In the graph 300, the amount of gain is 2. However, the system may be adjusted to achieve different amounts of gain based on desired system operation. The graph 300 illustrates a significant benefit of the NST system. Namely, the latency of the output 304 is minimized, and the signals corresponding to the input 302 and the output 304 are in-phase. Minimal latency between input and output signals is desirable in power converters and power inverters.

Figure 12A:
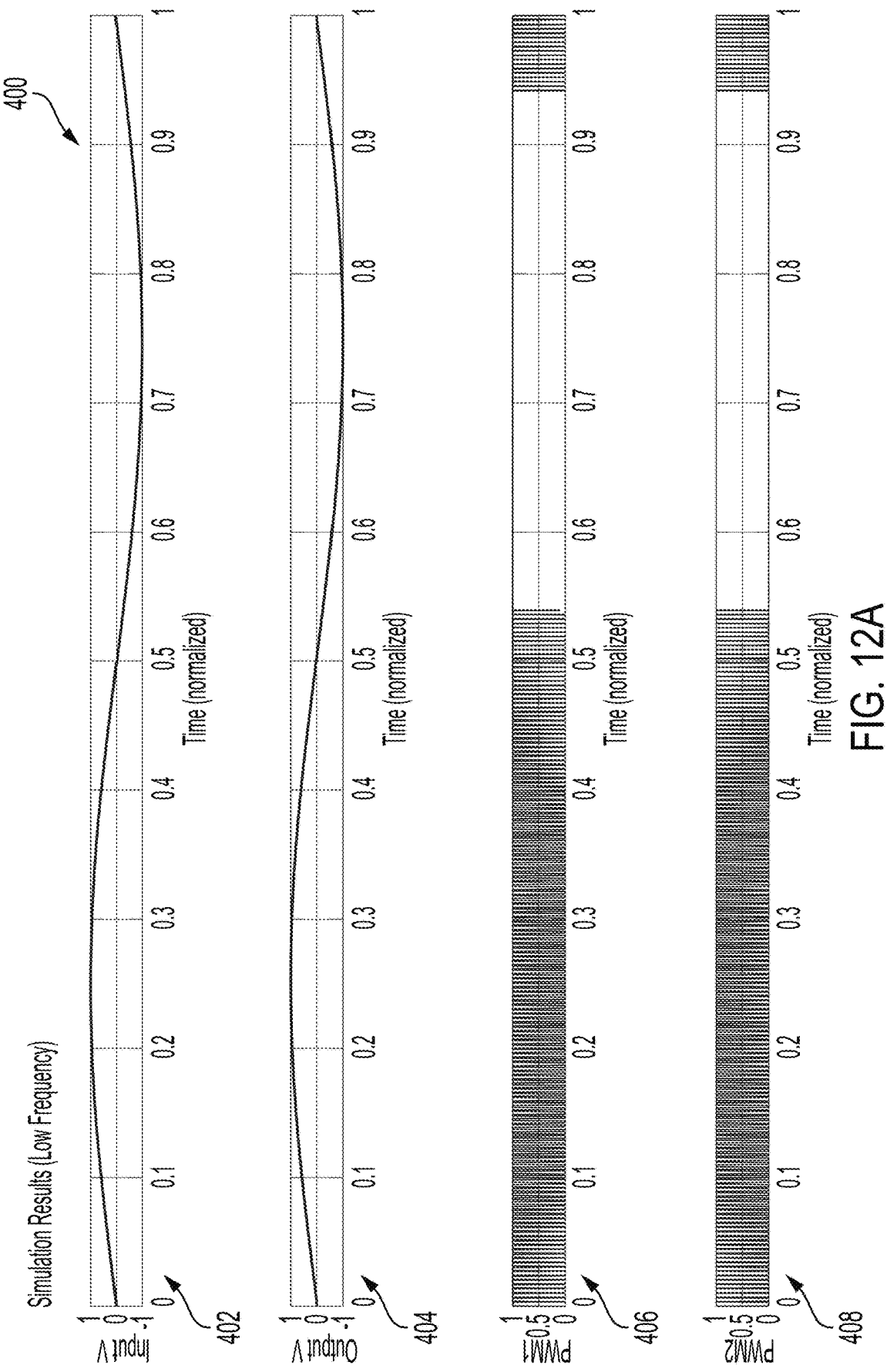
FIGS. 12A and 12B show a plot illustrating various signals from a simulation of a NST system utilizing relatively low frequencies, according to various embodiments of the present disclosure.
Figure 12B:
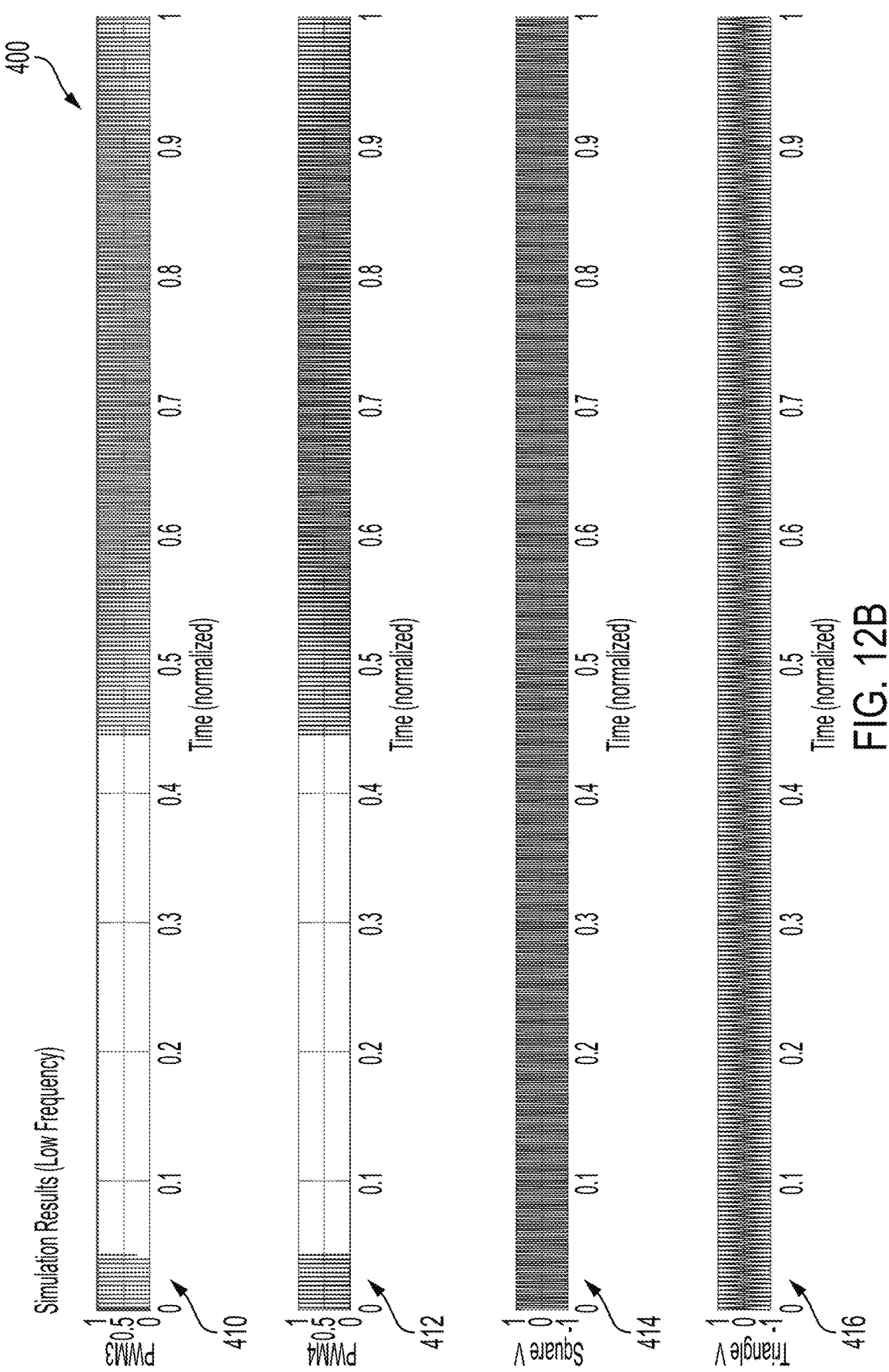

Referring to FIGS. 12A and 12B, a plot 400 illustrates simulation results for a simulation of an exemplary NST system (e.g., a NST system similar to the system 100 of FIGS. 1-5 or the system 200 of FIGS. 6-10) using a relatively low frequency input voltage signal (e.g., a frequency of between 10 hertz (10 Hz) and 10 kilohertz (10 kHz) is shown). The plot 400 is shown for a DC to AC inverter, but similar results may be obtained for an AC to DC converter. The plot 400 illustrates an input voltage signal 402, an output voltage signal 404, a first PWM signal 406, a first inverse PWM signal 408, a second PWM signal 410, a second inverse PWM signal 412, a square wave signal 414, and a triangle wave signal 416. All of the values shown in the plot 400 have been normalized.

The plot 400 illustrates multiple features and benefits of the NST system. As also indicated in FIG. 11 above, minimal latency exists between the input voltage signal 402 and the output voltage signal 404, thus the input and output signals are in phase. Similarly, the plot 400 shows that the output voltage signal 404 is advantageously of relatively high quality and is relatively smooth. The plot 400 also illustrates how the PWM signals 406, 408, 410, 412, the square wave signal 414, and the triangle wave signal 416 are generated in the various stages of the NST system, as well as the effect of these signals on the output voltage signal 404.

Figure 13A:
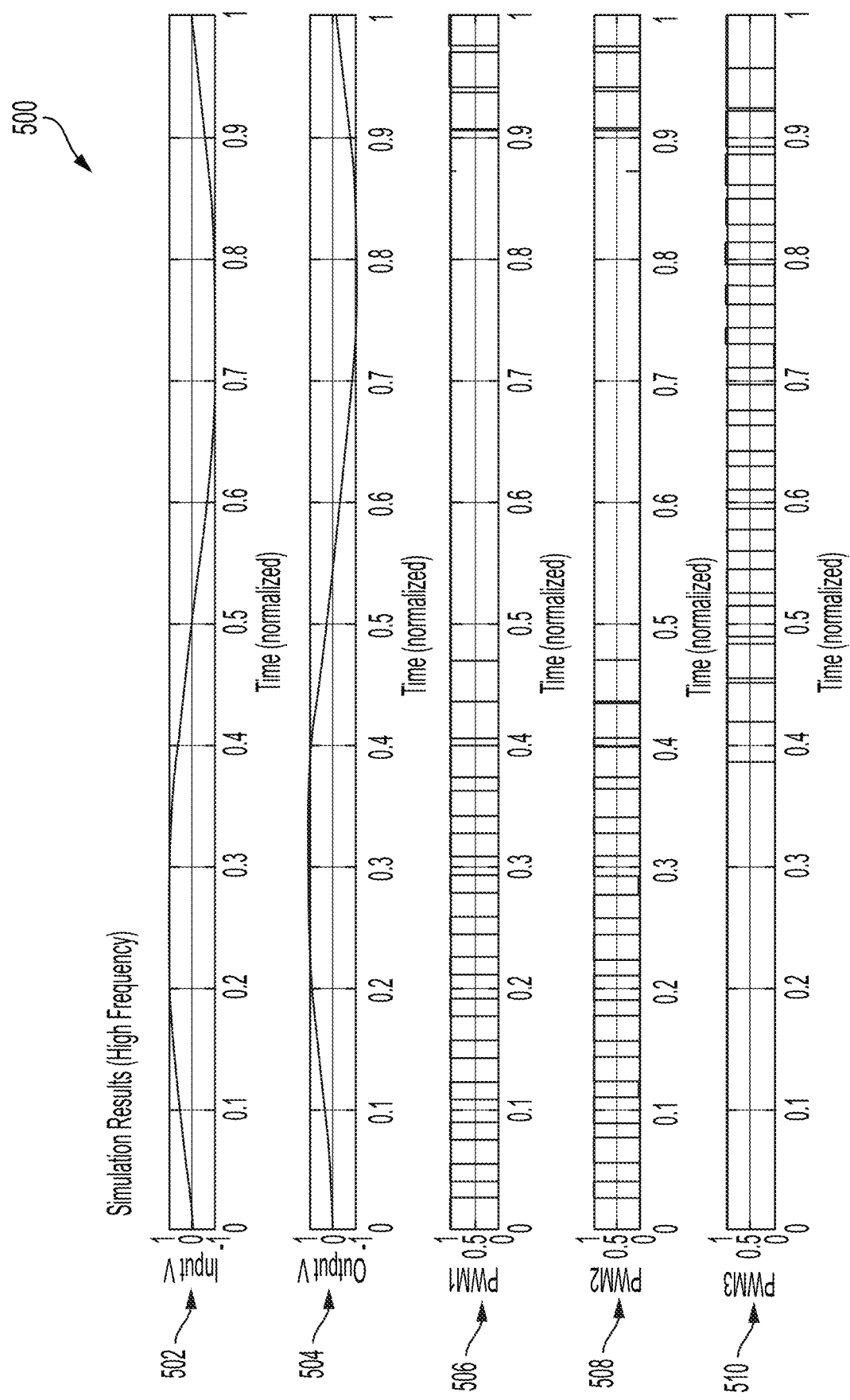
FIGS. 13A and 13B show a plot illustrating various signals from a simulation of a NST system using relatively high frequencies, according to various embodiments of the present disclosure.
Figure 13B:
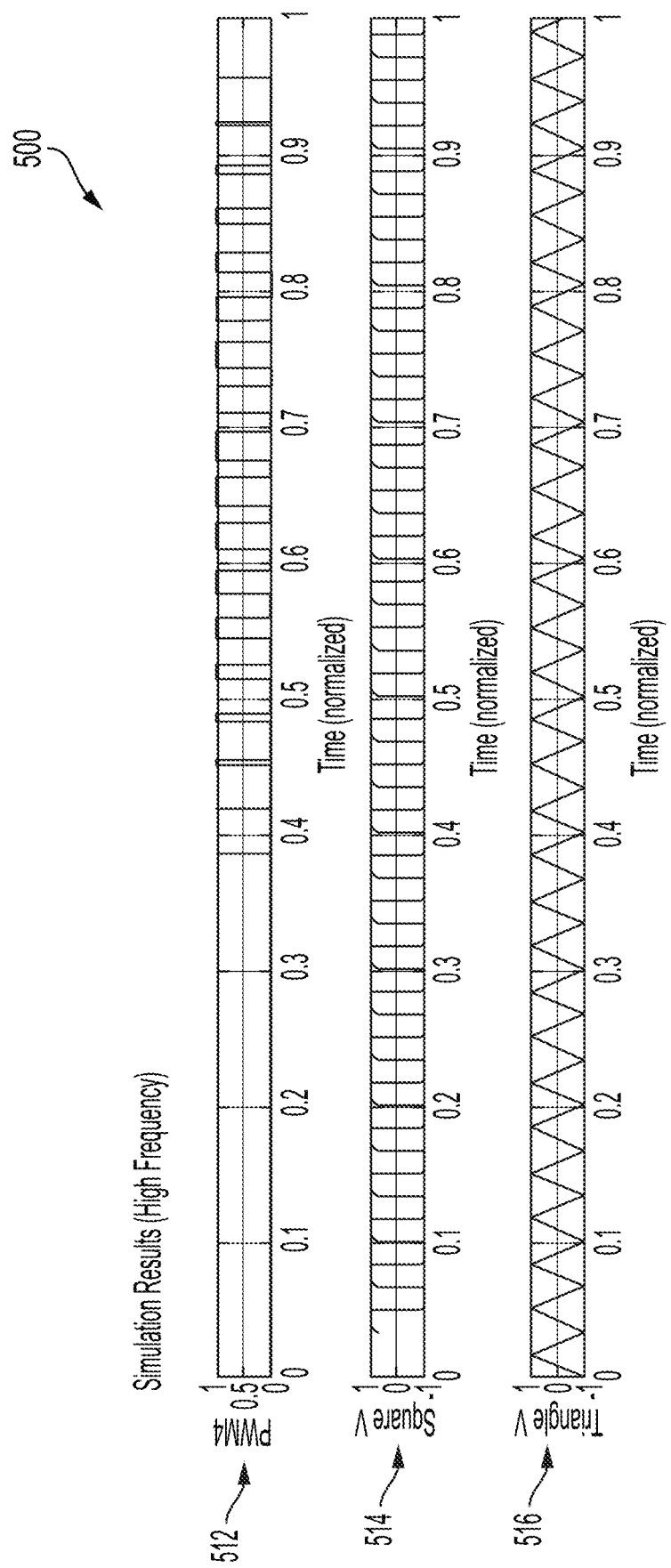

Referring to FIGS. 13A and 13B, a plot 500 illustrates simulation results for a simulation of an exemplary NST system (e.g., a NST system similar to the system 100 of FIGS. 1-5 or the system 200 of FIGS. 6-10) using a relatively high frequency input voltage signal (e.g., a frequency of between 10 kHz and 20 KHz is shown). The plot 500 is shown for a DC to AC inverter, but similar results may be obtained for an AC to DC converter. The plot 500 illustrates an input voltage signal 502, an output voltage signal 504, a first PWM signal 506, a first inverse PWM signal 508, a second PWM signal 510, a second inverse PWM signal 512, a square wave signal 514, and a triangle wave signal 516. All of the values shown in the plot 400 have been normalized.

The plot 500 illustrates multiple features and benefits of the NST system. As also indicated in FIGS. 11 and 12 above, minimal latency exists between the input voltage signal 502 and the output voltage signal 504, thus the input and output signals are in phase. Similarly, the plot 500 shows that the output voltage signal 504 is advantageously of relatively high quality and is relatively smooth, which is also the case for the relatively low frequency example shown in FIGS. 12A and 12B. The plot 500 also illustrates how the PWM signals 506, 508, 510, 512, the square wave signal 514, and the triangle wave signal 516 are generated in the various stages of the NST system, as well as the effect of these signals on the output voltage signal 504. Referring to FIGS. 12A, 12B, 13A, and 13B, the plots illustrate the difference in the PWM signals, the square wave signal, and the triangle wave signal between an implementation using a relatively low frequency input signal (the plot 400) and an implementation using a relatively high frequency input signal (the plot 500). Namely, the PWM signals, the square wave signal, and the triangle wave signal have a greater frequency relative to the input signal and the output signal in the implementation using the relatively low frequency input signal relative to the implementation using the relatively high frequency input signal.

Where used throughout the specification and the claims, "at least one of A or B" includes "A" only, "B" only, or "A and B." Furthermore, "at least one of A and B" includes "A" only, "B" only, or "A and B." Exemplary embodiments of the methods/systems have been disclosed in an illustrative style. Accordingly, the terminology employed throughout should be read in a non-limiting manner. Although minor modifications to the teachings herein will occur to those well versed in the art, it shall be understood that what is intended to be circumscribed within the scope of the patent warranted hereon are all such embodiments that reasonably fall within the scope of the advancement to the art hereby contributed, and that that scope shall not be restricted, except in light of the appended claims and their equivalents.

What is claimed is:

1. A method for increasing switching efficiency, the method comprising:
   generating a first signal based on at least one feedback signal;
   generating a first triangle wave signal by taking an inverse of a reference triangle wave signal;
   summing the first signal with the first triangle wave signal and with a square wave signal to generate a second signal;
   generating a second triangle wave signal and a third triangle wave signal, such that generating the second triangle wave signal includes combining the reference triangle wave signal with a positive reference signal, and such that generating the third triangle wave signal includes combining the reference triangle wave signal with a negative reference signal;
   comparing the second signal with the second triangle wave signal to generate a first pulse width modulation (PWM) signal, wherein generating the first PWM signal includes generating a first inverse PWM signal that is an inverse of the first PWM signal;
   comparing the second signal with the third triangle wave signal to generate a second PWM signal, wherein generating the second PWM signal includes generating a second inverse PWM signal that is an inverse of the second PWM signal;
   generating an output signal based on the first PWM signal and the second PWM signal, wherein generating the output signal further includes generating the at least one feedback signal; and
   driving a plurality of switches based on the first PWM signal, the first inverse PWM signal, the second PWM signal, and the second inverse PWM signal.

2. The method of claim 1, wherein the second triangle wave signal includes the first triangle wave signal with a first direct current (DC) offset, and wherein the third triangle wave signal includes the first triangle wave signal with a second DC offset.

3. The method of claim 2, wherein generating the output signal is further based on the first inverse PWM signal and the second inverse PWM signal.

4. The method of claim 2, wherein each of the first triangle wave signal, the second triangle wave signal, and the third triangle wave signal has a similar wave shape.

5. The method of claim 1, further comprising using an oscillator to generate the reference triangle wave signal and the square wave signal.

6. The method of claim 1, wherein the method is used in at least one of an alternating current (AC) to direct current (DC) converter or in a DC to AC inverter.

7. A system for increasing switching efficiency, the system comprising:
   a first stage configured to output a first signal based on an input signal;
   a second stage configured to:
      generate a first triangle wave signal by taking an inverse of a reference triangle wave signal, and
      sum the first signal with the first triangle wave signal and with a square wave signal to generate a second signal;
   a third stage configured to:
      generate a second triangle wave signal and a third triangle wave signal, such that generating the second triangle wave signal includes combining the reference triangle wave signal with a positive reference signal, and such that generating the third triangle wave signal includes combining the reference triangle wave signal with a negative reference signal, and
      compare the second signal with the second triangle wave signal to generate a first pulse width modulation (PWM) signal, and to compare the second signal with the third triangle wave signal to generate a second PWM signal, wherein generating the first PWM signal includes generating a first inverse PWM signal that is an inverse of the first PWM signal, and wherein generating the second PWM signal includes generating a second inverse PWM signal that is an inverse of the second PWM signal; and a fourth stage configured to:
generate an output signal based on the first PWM signal and the second PWM signal; and
drive a plurality of switches based on the first PWM signal, the first inverse PWM signal, the second PWM signal, and the second inverse PWM signal.

8. The system of claim 7, wherein the first stage is further configured to output the first signal based on at least one feedback signal, wherein the fourth stage is further configured to generate the at least one feedback signal, wherein the second triangle wave signal includes the first triangle wave signal with a first direct current (DC) offset, and wherein the third triangle wave signal includes the first triangle wave signal with a second DC offset.

9. The system of claim 8, wherein each of the first triangle wave signal, the second triangle wave signal, and the third triangle wave signal has a similar wave shape.

10. The system of claim 7, wherein the fourth stage is configured to generate the output signal further based on the first inverse PWM signal and the second inverse PWM signal.

11. The system of claim 10, wherein the fourth stage is configured to generate the output signal by driving the plurality of switches based on the first PWM signal, the first inverse PWM signal, the second PWM signal, and the second inverse PWM signal.

12. The system of claim 7, further comprising an oscillator configured to generate the reference triangle wave signal and the square wave signal.

13. The system of claim 7, wherein the system is implemented in at least one of an alternating current (AC) to direct current (DC) converter or in a DC to AC inverter.

14. A system for increasing switching efficiency, the system comprising:
a first stage configured to generate a first signal based on at least one feedback signal;
an inverter configured to generate a first triangle wave signal by taking an inverse of a reference triangle wave signal;
a first summer configured to sum the first signal with the first triangle wave signal and with a square wave signal to generate a second signal;
a third stage configured to generate a second triangle wave signal by combining the reference triangle wave signal with a positive reference signal, and to generate a third triangle wave signal by combining the reference triangle wave signal with a negative reference signal;
a first comparator configured to compare the second signal with the second triangle wave signal to generate a first pulse width modulation (PWM) signal, wherein generating the first PWM signal includes generating a first inverse PWM signal that is an inverse of the first PWM signal;
a second comparator configured to compare the second signal with the third triangle wave signal to generate a second PWM signal, wherein generating the second PWM signal includes generating a second inverse PWM signal that is an inverse of the second PWM signal;
a fourth stage configured to generate an output signal based on the first PWM signal and the second PWM signal, wherein generating the output signal further includes generating the at least one feedback signal; and
a plurality of switches configured to be driven based on the first PWM signal, the first inverse PWM signal, the second PWM signal, and the second inverse PWM signal.

15. The system of claim 14, wherein the second triangle wave signal includes the first triangle wave signal with a first direct current (DC) offset, and wherein the third triangle wave signal includes the first triangle wave signal with a second DC offset.

16. The system of claim 15, wherein each of the first triangle wave signal, the second triangle wave signal, and the third triangle wave signal has a similar wave shape.

* * * * *